United States Patent
Majhi et al.

(10) Patent No.: US 10,573,809 B2
(45) Date of Patent: Feb. 25, 2020

(54) RESISTIVE RANDOM ACCESS MEMORY WITH DEUTERIUM

(71) Applicant: Intel Corporation, Santa Clara, CA (US)

(72) Inventors: Prashant Majhi, San Jose, CA (US); Ravi Pillarisetty, Portland, OR (US); Uday Shah, Portland, OR (US); Elijah V. Karpov, Portland, OR (US); Niloy Mukherjee, Portland, OR (US); Pulkit Jain, Hillsboro, OR (US); Aravind S. Killampalli, Beaverton, OR (US); Jay P. Gupta, Hillsboro, OR (US); James S. Clarke, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 16/077,571

(22) PCT Filed: Mar. 31, 2016

(86) PCT No.: PCT/US2016/025430
§ 371 (c)(1),
(2) Date: Aug. 13, 2018

(87) PCT Pub. No.: WO2017/171819
PCT Pub. Date: Oct. 5, 2017

(65) Prior Publication Data
US 2019/0036020 A1    Jan. 31, 2019

(51) Int. Cl.
*H01L 45/00*    (2006.01)

(52) U.S. Cl.
CPC .......... *H01L 45/08* (2013.01); *H01L 45/1233* (2013.01); *H01L 45/1253* (2013.01); *H01L 45/146* (2013.01); *H01L 45/1641* (2013.01); *H01L 45/147* (2013.01)

(58) Field of Classification Search
CPC . H01L 45/08; H01L 45/1233; H01L 45/1253; H01L 45/146
See application file for complete search history.

(56) References Cited

U.S. PATENT DOCUMENTS

| | | |
|---|---|---|
| 2012/0313069 A1 | 12/2012 | Wang et al. |
| 2013/0221311 A1 | 8/2013 | Sekar et al. |
| 2015/0102279 A1 | 4/2015 | Fujii et al. |
| 2015/0243888 A1 | 8/2015 | Hopstaken et al. |

FOREIGN PATENT DOCUMENTS

KR    100647332 B1    11/2006

OTHER PUBLICATIONS

The International Searching Authority, Written Opinion of the International Searching Authority and the International Search Report dated Dec. 16, 2016 in International Application No. PCT/US2016/025430, 11 pages.
E. Yalon, et al., "Detection of the Insulating Gap and Conductive Filament Growth Direction in Resistive Memories," Royal Society of Chemistry, Nanoscale 2015, 8 pages.

*Primary Examiner* — Allison Bernstein
(74) *Attorney, Agent, or Firm* — Trop, Pruner & Hu, P.C.

(57) ABSTRACT

An embodiment includes a memory comprising: a top electrode and a bottom electrode; an oxygen exchange layer (OEL) between the top and bottom electrodes; and an oxide layer between the OEL and the bottom electrode; wherein the oxide layer includes Deuterium and oxygen vacancies. Other embodiments are described herein.

25 Claims, 6 Drawing Sheets

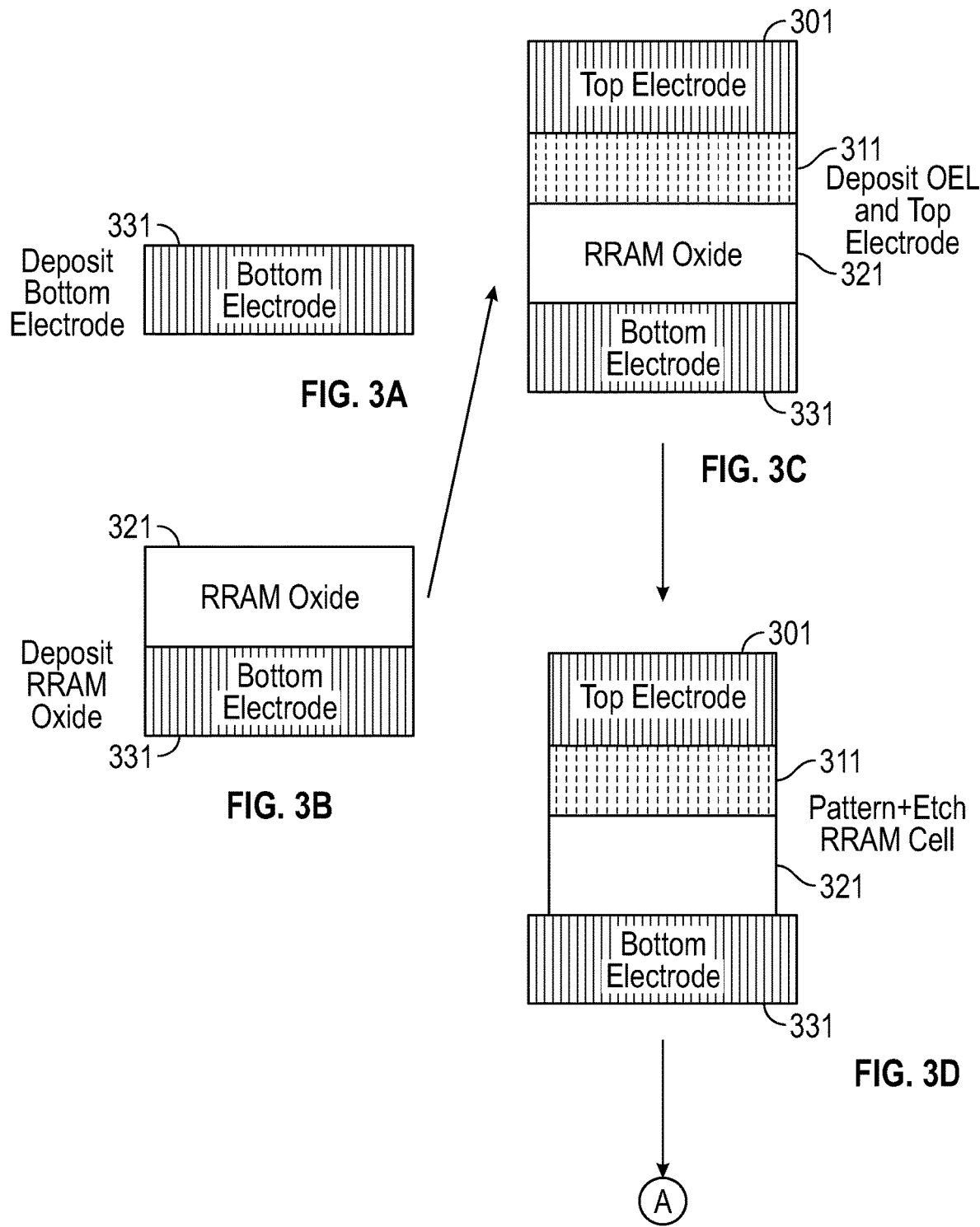

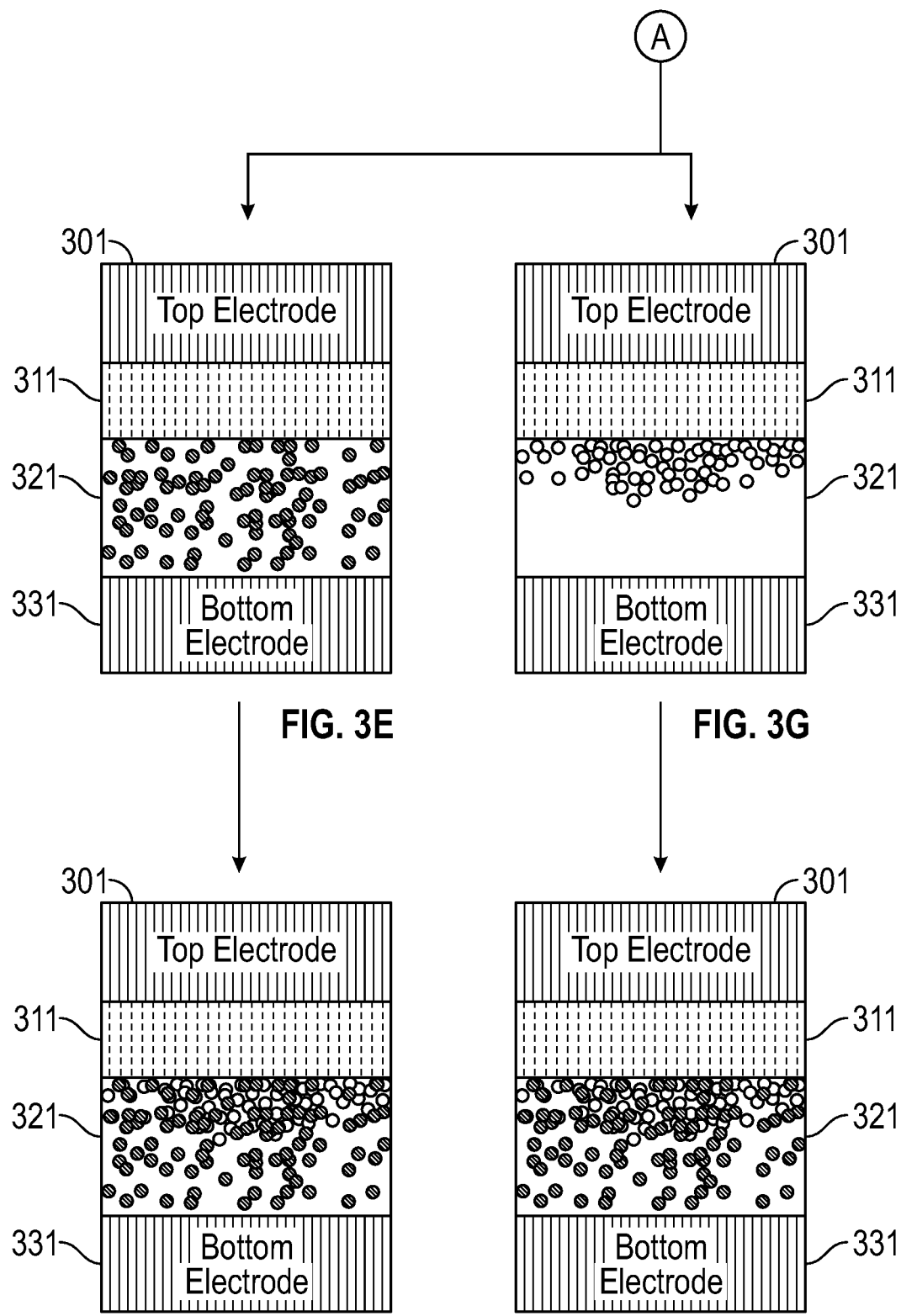

RESISTIVE RANDOM ACCESS MEMORY WITH DEUTERIUM

TECHNICAL FIELD

Embodiments of the invention are in the field of semiconductor devices and, in particular, non-volatile memory.

BACKGROUND

Resistive random access memory (RRAM or ReRAM) relies on a class of materials that switch in a one-time event from a virgin insulating state to a low resistive state by way of a "forming" event. In the forming event, the device goes through "soft breakdown" in which a localized filament forms in a dielectric layer located between two electrodes. This filament shunts current through the filament to form a low resistance state. The RRAM switches from a low to a high resistive state (by disbanding the filament) and from a high to a low resistive state (by reforming the filament) by applying voltages of different polarities to the electrodes to switch the state. Thus, conventional RRAM can serve as a memory.

BRIEF DESCRIPTION OF THE DRAWINGS

Features and advantages of embodiments of the present invention will become apparent from the appended claims, the following detailed description of one or more example embodiments, and the corresponding figures. Where considered appropriate, reference labels have been repeated among the figures to indicate corresponding or analogous elements.

FIGS. 3A-3H include a method of forming a RRAM stack in an embodiment of the invention.

DETAILED DESCRIPTION

Reference will now be made to the drawings wherein like structures may be provided with like suffix reference designations. In order to show the structures of various embodiments more clearly, the drawings included herein are diagrammatic representations of semiconductor/circuit structures. Thus, the actual appearance of the fabricated integrated circuit structures, for example in a photomicrograph, may appear different while still incorporating the claimed structures of the illustrated embodiments. Moreover, the drawings may only show the structures useful to understand the illustrated embodiments. Additional structures known in the art may not have been included to maintain the clarity of the drawings. For example, not every layer of a semiconductor device is necessarily shown. "An embodiment", "various embodiments" and the like indicate embodiment(s) so described may include particular features, structures, or characteristics, but not every embodiment necessarily includes the particular features, structures, or characteristics. Some embodiments may have some, all, or none of the features described for other embodiments. "First", "second", "third" and the like describe a common object and indicate different instances of like objects are being referred to. Such adjectives do not imply objects so described must be in a given sequence, either temporally, spatially, in ranking, or in any other manner. "Connected" may indicate elements are in direct physical or electrical contact with each other and "coupled" may indicate elements co-operate or interact with each other, but they may or may not be in direct physical or electrical contact.

Figures 1, 2:
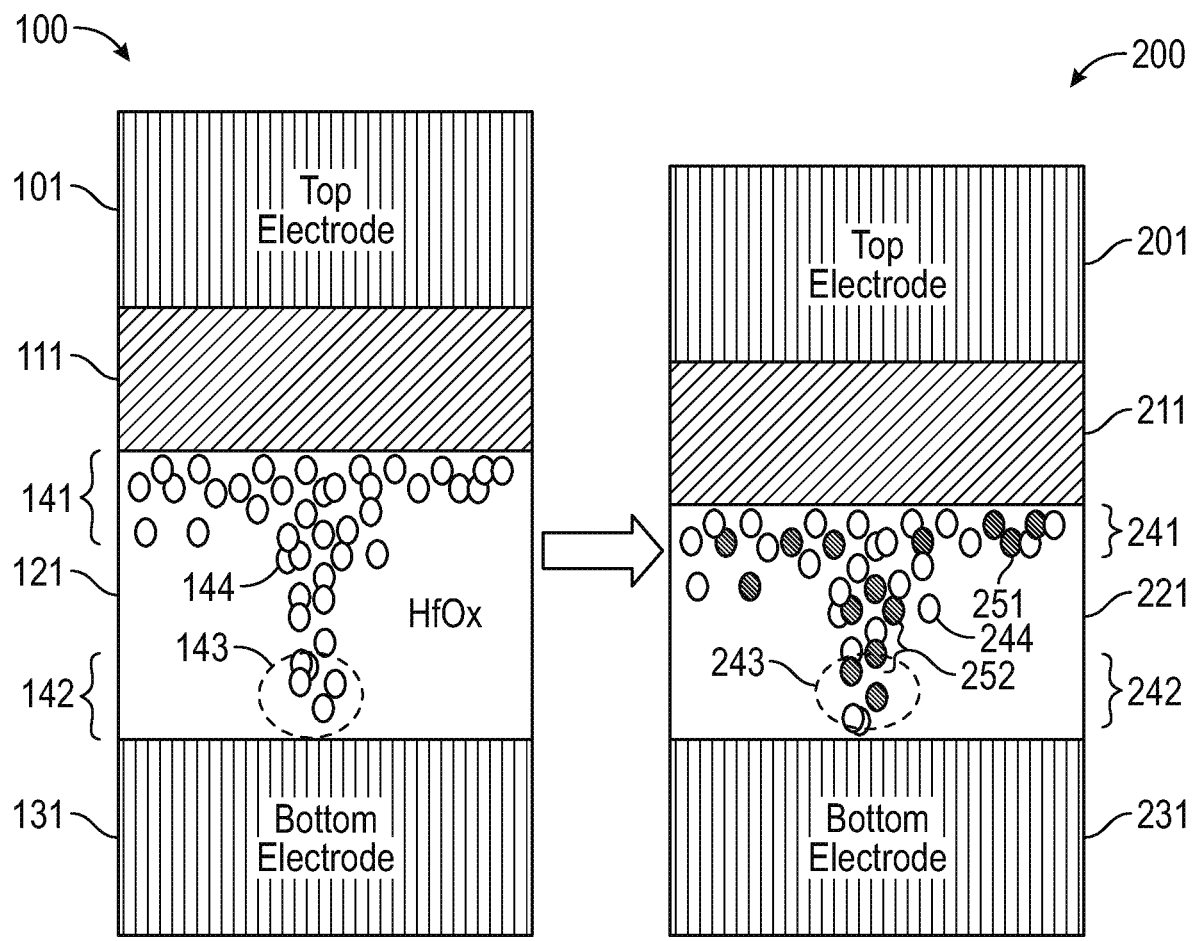
FIG. 1 includes a conventional RRAM stack.
FIG. 2 includes a RRAM stack in an embodiment of the invention.

FIG. 1 includes a conventional RRAM stack 100 including top electrode 101, oxygen exchange layer (OEL) 111 (e.g., Hf, Ti, and the like), oxide 121 (e.g., HfOx), and bottom electrode 131. Oxygen vacancies 144 have a higher concentration in region 141 and a relatively lower concentration in region 142. The vacancies collectively form a filament that serves as a memory. As addressed above, a "soft breakdown" occurs whereby, for example, an anneal takes place such that oxygen is scavenged by OEL 111 thereby producing vacancies 144. The vacancies cluster near the OEL/oxide interface (interface between layers 111 and 121) because that is where the scavenging takes place. Biasing electrodes 101, 131 with one polarity may purposely remove vacancies in area 143 to disband or disrupt the filament and create a high resistance state (a "0" memory state). Reversing the bias to electrodes 101, 131 with an opposite polarity may reform vacancies in area 143 to reform the filament and create a low resistance state (a "1" memory state).

Applicant determined switching between the low and high resistance states can be problematic. More specifically, oxygen vacation is formation is unreliable and difficult in conventional RRAM. However, Applicant has further determined RRAM formation and RRAM state switching can be improved by doping the RRAM stack with Deuterium (D2). Doing so reduces oxygen vacancy formation energy and, as a result, the energy need to form the filament.

Specifically, an embodiment reduces (as in a reduction-oxidation (redox) reaction) the RRAM oxide to create abundant oxygen vacancies. The abundant oxygen vacancies improves the switching characteristics (i.e., ability to switch resistance states) of the filament. This is achieved by doping the RRAM oxide with D2. The D2 may be included within the RRAM oxide via annealing. The annealing may be performed at ambient conditions or through a range of temperatures and pressures. The annealing of the oxide with D2 in the oxide reduces the RRAM oxide to create more oxygen vacancies. The D2 interacts with the oxygen vacancies to form D2/Vo complexes (D-Vo) that improve the switching kinetics of the RRAM filament.

The D2 doping not only reduces oxygen vacancy formation energy by stabilizing+1 charged VO's (i.e., oxidized element via the redox reaction between D2 and the oxide), which are necessary to form conductive filaments. The stabilization also helps form more stable conductive filaments. Also, the D-Vo complexes recombine easily with oxygen interstitials (Oi) to provide for improved reset (switching to a high resistive state). As a result of the D2 stabilized oxygen vacancies, RRAM devices with D2 doping exhibit: (1) increased yield, (2) reduced or eliminated VFORM, (initial formation of the filament during the forming event) (3) greater endurance or longevity for the memory, (4) and longer retention times of memory states.

FIG. 2 includes an embodiment of an RRAM memory thin film stack with improved reliability and switching properties. In particular, oxide 221 now includes D2 251 to stabilize oxygen vacancies 244. Such an embodiment improves the reliability and speed of filamentary based RRAM memory and makes the memory more suitable for, as an example, embedded nonvolatile memory.

FIG. 2 includes RRAM memory stack 200 comprising top electrode 201, bottom electrode 231, OEL 211, and oxide layer 221. A first plurality of oxygen vacancies 241 and D2 251 are adjacent the OEL at a first concentration and a second plurality of oxygen vacancies 242 and D2 251 are adjacent the second oxide layer at a second concentration that is less than the first concentration. "Adjacent" or "immediately adjacent", as used herein, are relative terms. Thus, some D-Vo complexes 252 in area 242 are adjacent layer 231 but not layer 211 and complexes 252 in area 241 are adjacent layer 211 but not layer 231.

In an embodiment OEL 211 includes a metal such as one or more of the following: Hafnium (Hf), Titanium (Ti), Tantalum (Ta), Erbium (Er), and Gadolinium (Gd). In an embodiment oxide layer 221 includes at least one of $HfO_x$, $SiO_x$, $Al_2O_x$, TiOx, TaOx, GdOx, ErOx, NbOx, WOx, ZnOx, InSnO, and InGaZnOx. In an embodiment top electrode 201 includes at least one of TiN, TaN, W, Ru, Ir, TiAlN, and TaAlN and the bottom electrode 231 includes at least one of W, Pd, Pt, Ru, Mo, Ir, TiN, TiAlN, and TaAlN. Additionally, electrodes 201, 231 may include multiple layers of materials with differing properties.

In an embodiment the oxide layer 221 directly contacts the OEL 211 to allow for scavenging of oxygen from oxide layer 221 and the resultant creation of vacancies 244.

RRAM stack 200 is a functioning nonvolatile memory in that in a first state (when energy is applied to the top electrode at a first polarity) the first and second pluralities of oxygen vacancies form a first filament having a first electrical resistance; and in a second state (when energy is applied to the top electrode at a second polarity, which is opposite the first polarity) the first and second pluralities of oxygen vacancies form a different filament configuration or discontinuity thereby causing the higher resistivity.

In the second state the plurality of oxygen vacancies at area 242 is at a low concentration (second concentration) and in the first state the plurality of oxygen vacancies at area 242 is at a concentration that is greater than the second concentration.

FIGS. 3a-3e include a method of forming a RRAM stack in an embodiment of the invention. In FIG. 3a the bottom electrode 331 is formed. In FIG. 3b oxide 321 is formed followed by OEL 311 and top electrode 301 (FIG. 3c). Patterning and etching occur to form the RRAM cell (FIG. 3d).

Following the creation of the RRAM stack (FIG. 3D), the D2 doping can be done either before or after the anneal treatment, which induces the reaction between the OEL and RRAM oxide to create oxygen vacancies. FIGS. 3E and 3F depict first doping the oxide with D2 (FIG. 3E) and then annealing the doped oxide to form the oxygen vacancies and D-Vo complexes (FIG. 3F). FIGS. 3G and 3H depict first annealing the oxide to form oxygen vacancies (FIG. 3G) and then doping the annealed oxide with D2 to form the D-Vo complexes (FIG. 3H). Afterward either of FIG. 3F or 3H, a forming event may occur to produce a filament such as the filament shown in FIG. 2.

Various embodiments disclosed herein have addressed RRAM stacks. Any such RRAM stack may be used in a memory cell by coupling one portion or node of the stack (e.g., top electrode of FIG. 2) to a bit-line and another node of the stack (e.g., bottom electrode of FIG. 2) to a source or drain node of a switching device, such as a selection transistor. The other of the source and drain node of the selection transistor may be coupled to a source line of the memory cell. The gate of the selection transistor may couple to a word-line. Such a memory cell may utilize resistance to store memory states. Embodiments provide smaller and more power efficient memory cells that can be scaled below, for example, 22 nm CD. The RRAM stack may couple to a sense amplifier. A plurality of the RRAM memory cells may be operably connected to one another to form a memory array, wherein the memory array can be incorporated into a non-volatile memory device. It is to be understood that the selection transistor may be connected to the top electrode or the bottom electrode of a RRAM stack.

Figure 4:
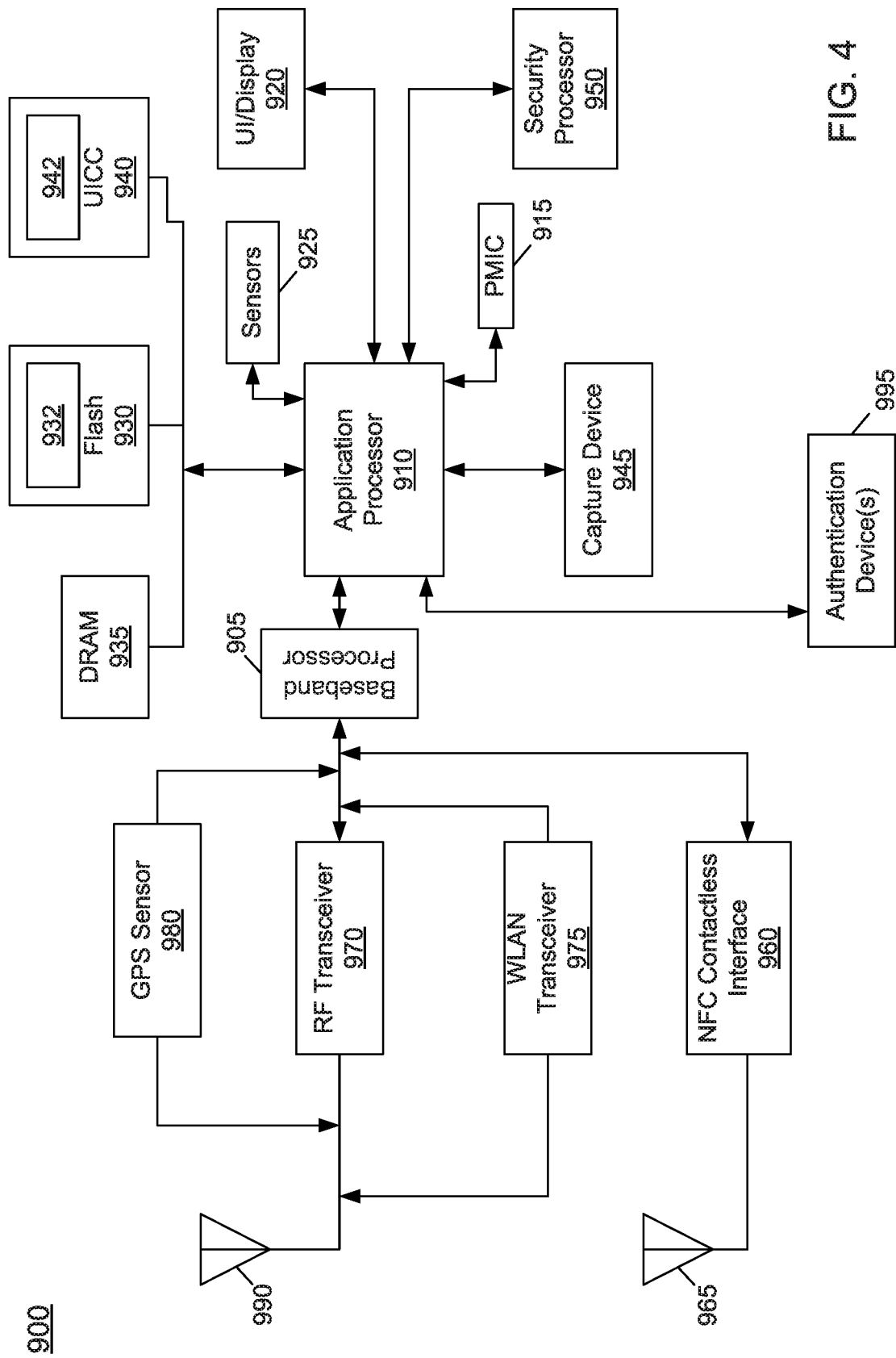
FIG. 4 includes a system including an embodiment of the RRAM stack.
Figure 5:
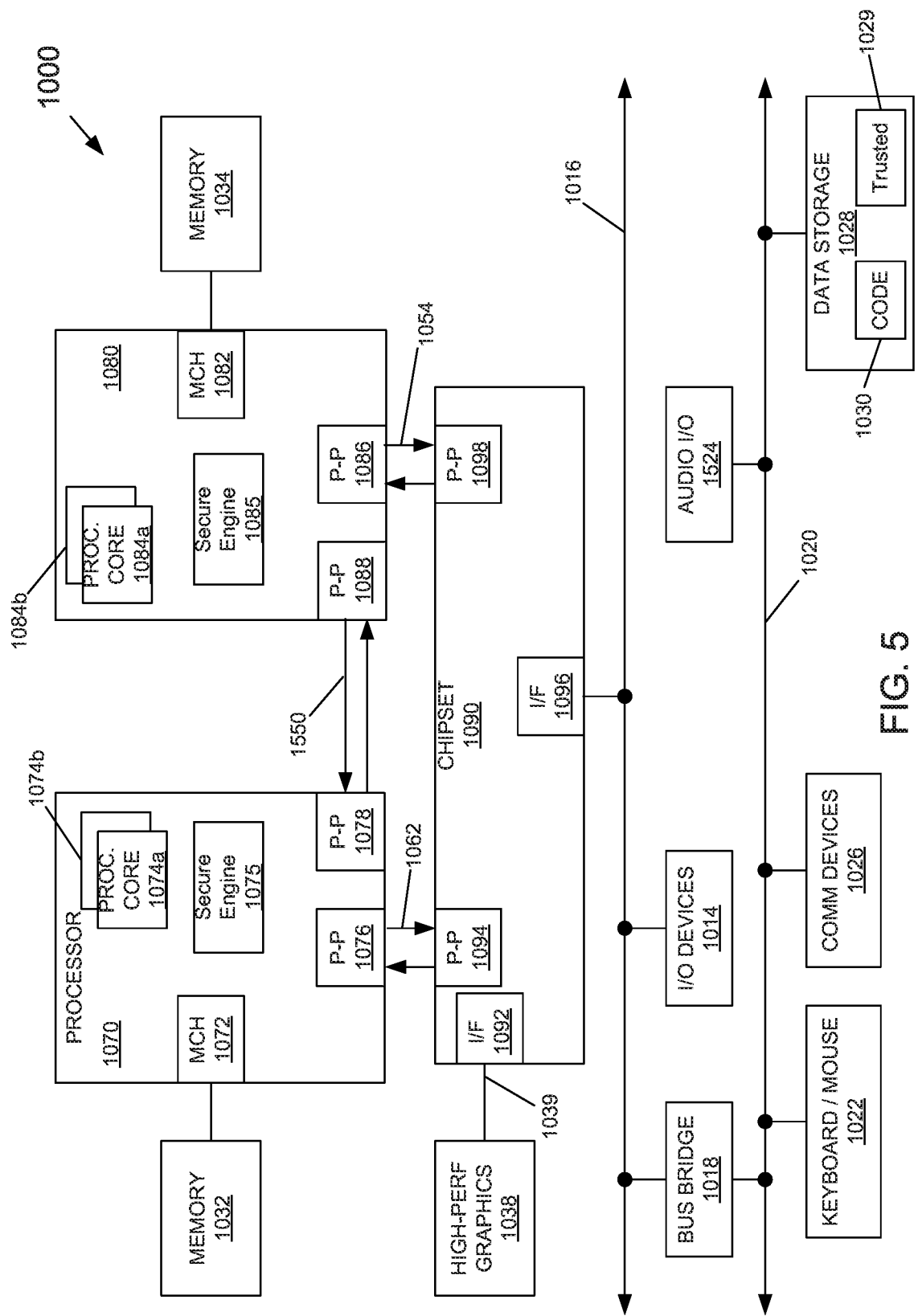
FIG. 5 includes a system including an embodiment of the RRAM stack.
Figure 6:
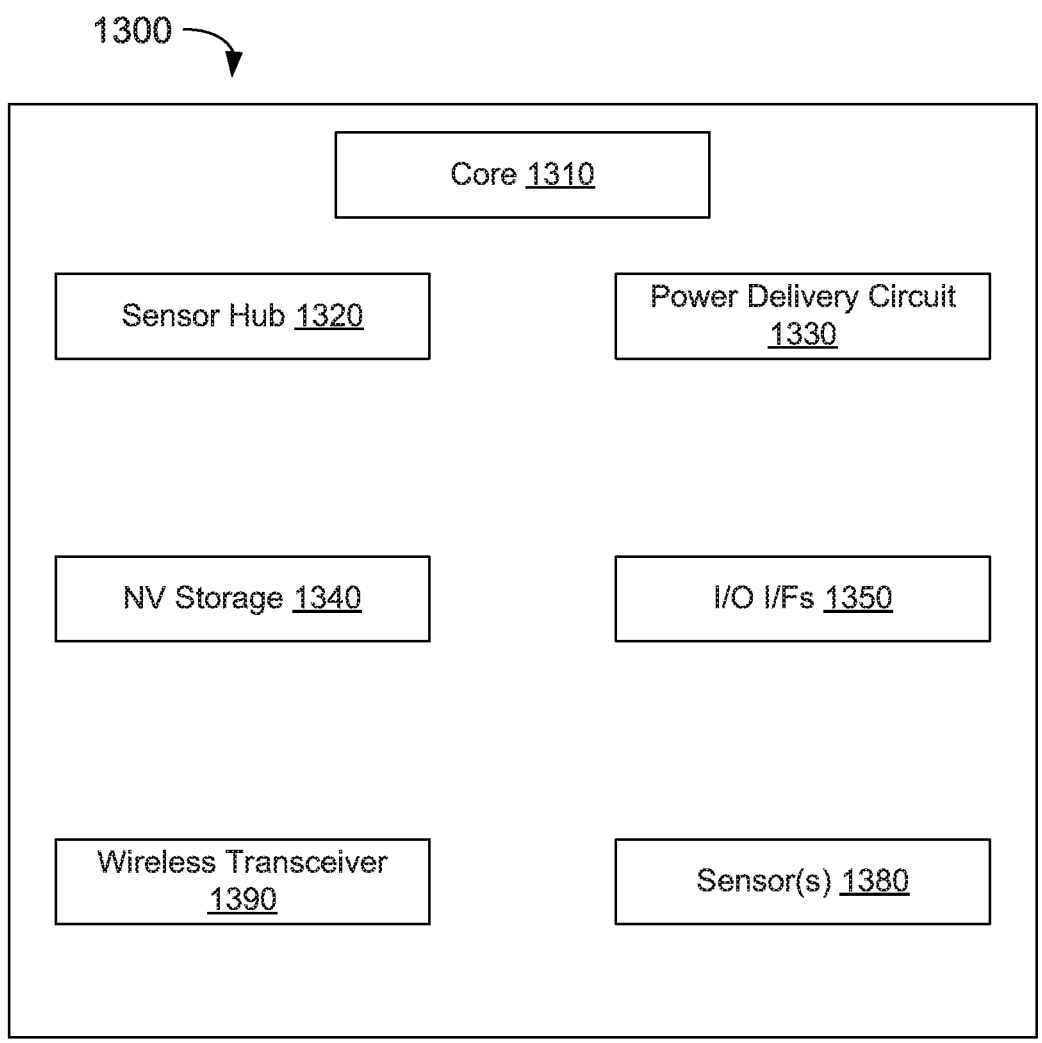
FIG. 6 includes a system including an embodiment of the RRAM stack.

FIGS. 4, 5, 6 each include a system that may include any of the above described embodiments. FIGS. 4, 5, and 6 include block diagrams of systems 900, 1000, 1300 in accordance with embodiments. Each of those systems may include hundreds or thousands of the above described memory cells/stacks (stack 200 of FIG. 2) and be critical to memory functions in those systems. The memory cells may be included in, for example, elements 910, 930, 1070, 1032, 1090, 1310, 1340, 1380, and the like. Systems 900, 1000, 1300 may be included in, for example, a mobile computing node such as a cellular phone, smartphone, tablet, Ultrabook®, notebook, laptop, personal digital assistant, and mobile processor based platform. The stability and power efficiency of such memory cells accumulates when the memory cells are deployed in mass and provides significant performance advantages (e.g., longer memory state storage in a broader range of operating temperatures) to such computing nodes.

Referring now to FIG. 4, shown is a block diagram of an example system with which embodiments can be used. As seen, system 900 may be a smartphone or other wireless communicator or any other IoT device. A baseband processor 905 is configured to perform various signal processing with regard to communication signals to be transmitted from or received by the system. In turn, baseband processor 905 is coupled to an application processor 910, which may be a main CPU of the system to execute an OS and other system software, in addition to user applications such as many well-known social media and multimedia apps. Application processor 910 may further be configured to perform a variety of other computing operations for the device.

In turn, application processor 910 can couple to a user interface/display 920, e.g., a touch screen display. In addition, application processor 910 may couple to a memory system including a non-volatile memory, namely a flash memory 930 and a system memory, namely a DRAM 935. In some embodiments, flash memory 930 may include a secure portion 932 in which secrets and other sensitive information may be stored. As further seen, application processor 910 also couples to a capture device 945 such as one or more image capture devices that can record video and/or still images.

A universal integrated circuit card (UICC) 940 comprises a subscriber identity module, which in some embodiments includes a secure storage 942 to store secure user information. System 900 may further include a security processor 950 that may couple to application processor 910. A plurality of sensors 925, including one or more multi-axis accelerometers may couple to application processor 910 to enable input of a variety of sensed information such as motion and other environmental information. In addition, one or more authentication devices 995 may be used to receive, e.g., user biometric input for use in authentication operations.

As further illustrated, a near field communication (NFC) contactless interface 960 is provided that communicates in a NFC near field via an NFC antenna 965. While separate antennae are shown, understand that in some implementations one antenna or a different set of antennae may be provided to enable various wireless functionalities.

A power management integrated circuit (PMIC) 915 couples to application processor 910 to perform platform level power management. To this end, PMIC 915 may issue power management requests to application processor 910 to enter certain low power states as desired. Furthermore, based on platform constraints, PMIC 915 may also control the power level of other components of system 900.

To enable communications to be transmitted and received such as in one or more IoT networks, various circuitries may be coupled between baseband processor 905 and an antenna 990. Specifically, a radio frequency (RF) transceiver 970 and a wireless local area network (WLAN) transceiver 975 may be present. In general, RF transceiver 970 may be used to receive and transmit wireless data and calls according to a given wireless communication protocol such as 3G or 4G wireless communication protocol such as in accordance with a code division multiple access (CDMA), global system for mobile communication (GSM), long term evolution (LTE) or other protocol. In addition a GPS sensor 980 may be present, with location information being provided to security processor 950 for use as described herein when context information is to be used in a pairing process. Other wireless communications such as receipt or transmission of radio signals, e.g., AM/FM and other signals may also be provided. In addition, via WLAN transceiver 975, local wireless communications, such as according to a Bluetooth™ or IEEE 802.11 standard can also be realized.

Referring now to FIG. 5, shown is a block diagram of a system in accordance with another embodiment of the present invention. Multiprocessor system 1000 is a point-to-point interconnect system such as a server system, and includes a first processor 1070 and a second processor 1080 coupled via a point-to-point interconnect 1050. Each of processors 1070 and 1080 may be multicore processors such as SoCs, including first and second processor cores (i.e., processor cores 1074a and 1074b and processor cores 1084a and 1084b), although potentially many more cores may be present in the processors. In addition, processors 1070 and 1080 each may include a secure engine 1075 and 1085 to perform security operations such as key management, attestations, IoT network onboarding or so forth.

First processor 1070 further includes a memory controller hub (MCH) 1072 and point-to-point (P-P) interfaces 1076 and 1078. Similarly, second processor 1080 includes a MCH 1082 and P-P interfaces 1086 and 1088. MCH's 1072 and 1082 couple the processors to respective memories, namely a memory 1032 and a memory 1034, which may be portions of main memory (e.g., a DRAM) locally attached to the respective processors. First processor 1070 and second processor 1080 may be coupled to a chipset 1090 via P-P interconnects 1052 and 1054, respectively. As shown in FIG. 6, chipset 1090 includes P-P interfaces 1094 and 1098.

Furthermore, chipset 1090 includes an interface 1092 to couple chipset 1090 with a high performance graphics engine 1038, by a P-P interconnect 1039. In turn, chipset 1090 may be coupled to a first bus 1016 via an interface 1096. Various input/output (I/O) devices 1014 may be coupled to first bus 1016, along with a bus bridge 1018 which couples first bus 1016 to a second bus 1020. Various devices may be coupled to second bus 1020 including, for example, a keyboard/mouse 1022, communication devices 1026 and a data storage unit 1028 such as a non-volatile storage or other mass storage device. As seen, data storage unit 1028 may include code 1030, in one embodiment. As further seen, data storage unit 1028 also includes a trusted storage 1029 to store sensitive information to be protected. Further, an audio I/O 1024 may be coupled to second bus 1020.

Embodiments may be used in environments where Internet of Things (IoT) devices may include wearable devices or other small form factor IoT devices. Referring now to FIG. 6, shown is a block diagram of a wearable module 1300 in accordance with another embodiment. In one particular implementation, module 1300 may be an Intel® Curie™ module that includes multiple components adapted within a single small module that can be implemented as all or part of a wearable device. As seen, module 1300 includes a core 1310 (of course in other embodiments more than one core may be present). Such core may be a relatively low complexity in-order core, such as based on an Intel Architecture® Quark™ design. In some embodiments, core 1310 may implement a TEE as described herein. Core 1310 couples to various components including a sensor hub 1320, which may be configured to interact with a plurality of sensors 1380, such as one or more biometric, motion environmental or other sensors. A power delivery circuit 1330 is present, along with a non-volatile storage 1340. In an embodiment, this circuit may include a rechargeable battery and a recharging circuit, which may in one embodiment receive charging power wirelessly. One or more input/output (IO) interfaces 1350, such as one or more interfaces compatible with one or more of USB/SPI/I2C/GPIO protocols, may be present. In addition, a wireless transceiver 1390, which may be a Bluetooth™ low energy or other short-range wireless transceiver is present to enable wireless communications as described herein. Understand that in different implementations a wearable module can take many other forms. Wearable and/or IoT devices have, in comparison with a typical general purpose CPU or a GPU, a small form factor, low power requirements, limited instruction sets, relatively slow computation throughput, or any of the above.

Various embodiments include a semiconductive substrate. Such a substrate may be a bulk semiconductive material this is part of a wafer. In an embodiment, the semiconductive substrate is a bulk semiconductive material as part of a chip that has been singulated from a wafer. In an embodiment, the semiconductive substrate is a semiconductive material that is formed above an insulator such as a semiconductor on insulator (SOI) substrate. In an embodiment, the semiconductive substrate is a prominent structure such as a fin that extends above a bulk semiconductive material.

The following examples pertain to further embodiments.

Example 1 includes a memory comprising: a top electrode and a bottom electrode; an oxygen exchange layer (OEL) between the top and bottom electrodes; and an oxide layer, including oxide, between the OEL and the bottom electrode; wherein the oxide layer includes Deuterium and oxygen vacancies.

Detection of Deuterium in the oxide layer may be accomplished using, for example, Time-of-Flight Elastic Recoil Detection Analysis (TOF-ERDA), Rutherford back scattering (RBS), high resolution Time-of-Flight secondary ion mass spectroscopy (TOFSIMS), and/or local electrode atom probe (LEAP) tomography. Oxygen vacancies may be detected using, for example, X-ray Photoelectron Spectroscopy (XPS), electron energy loss spectroscopy (EELS), and/or LEAP tomography. To detect oxygen vacancies one may actually detect a lack of oxygen from a non-stoichiometric portion of the oxide. This lack of oxygen is evidence of the oxygen vacancies.

Further, to detect portions of the films that are stoichiometric one can use depth profiling or line scan analysis while conducting the aforementioned characterizations.

"Top" and "bottom" are relative terms and may change based on the orientation of the stack. OEL is a term of art known to those of ordinary skill in the art. The OEL may also be referred to as a "metal cap layer". The OEL may include a metal such that, when the OEL is adjacent or contacting an oxygen source (e.g., oxide layer), the OEL facilitates "oxygen exchange" with the oxygen source. In an embodiment, OEL 211 may include substoichiometric oxide or metal that is not fully oxidized.

In example 2 the subject matter of the Example 1 can optionally include wherein the Deuterium is oxidized and a portion of the oxide is reduced.

The bonding state of Deuterium and oxygen (i.e., oxidation) may be determined by analyzing XPS and/or EELS profiles. For example, such profiles may show whether oxygen is bonded to Deuterium and/or other elements. Further, Fourier Transform Infrared (FTIR) Spectroscopy may be used to detect the bonding state of oxygen in thin films such as the films of examples 1 and 2.

In example 3 the subject matter of the Examples 1-2 can optionally include wherein: (a) the portion of the oxide is non-stoichiometric, and (b) an additional portion of oxide is not reduced and is stoichiometric.

The portion that is non-stoichiometric may be identified using, for example, XPS, EELS, and/or LEAP tomography. Depth profiling and/or line scan analysis may be used while conducting these characterizations. Similarly, to detect portions of the films that are stoichiometric one can use depth profiling or line scan analysis.

In some embodiments not all of the oxide chemically engages in a redox reaction with D2. The portion of oxide that does engage in the reaction may be reduced to a non-stoichiometric condition.

In example 4 the subject matter of the Examples 1-3 can optionally include wherein the Deuterium is chemically bound to the oxygen vacancies.

As noted above, the bonding state of Deuterium may be determined by analyzing XPS and/or EELS profiles.

In example 5 the subject matter of the Examples 1-4 can optionally include wherein the oxide includes a lattice structure and the Deuterium is directly adjacent the oxygen vacancies in the lattice structure to stabilize the oxygen vacancies.

In example 6 the subject matter of the Examples 1-5 can optionally include wherein the oxide layer includes: (a) a first plurality of oxygen vacancies, at an upper surface of the oxide layer that is adjacent the OEL, at a first concentration, and (b) a second plurality of oxygen vacancies, at a lower surface of the oxide layer, at a second concentration that is less than the first concentration.

For example, see FIG. 2.

The composition of the oxide layer (e.g., sub-stoichiometry and/or presence of Deuterium) as well as its spatial distribution and bonding state can be characterized by using a comprehensive set of analytical techniques such as, for example, TOF-ERDA, RBS, TOFSIMS, XPS, EELS, and/or FTIR.

In example 7 the subject matter of the Examples 1-6 can optionally include in a first state when energy is applied to the top electrode at a first polarity the first and second pluralities of oxygen vacancies form a first filament having a first electrical resistance; and in a second state when energy is applied to the top electrode at a second polarity, which is opposite the first polarity, the first and second pluralities of oxygen vacancies form a second filament having a second electrical resistance that is greater than the first electrical resistance.

The second electrical resistance may be very high when the path is incomplete due to an absence of vacancies at area 243.

In example 8 the subject matter of the Examples 1-7 can optionally include wherein in the second state the second plurality of oxygen vacancies is at the second concentration and in the first state the second plurality of oxygen vacancies is at an additional concentration that is greater than the second concentration.

In example 9 the subject matter of the Examples 1-8 can optionally include wherein the OEL includes a metal.

In example 10 the subject matter of the Examples 1-9 can optionally include wherein the metal includes at least one member selected from the group comprising: Hafnium (Hf), Titanium (Ti), Tantalum (Ta), Erbium (Er), and Gadolinium (Gd).

In example 11 the subject matter of the Examples 1-10 can optionally include wherein the oxide layer includes at least one member selected from the group comprising $HfO_x$, $SiO_x$, $Al_2O_xTiO_x$, TaOx, GdOx, ErOx, NbOx, WOx, ZnOx, and InGaZnOx.

A term like SiOx and the like is shorthand and includes instances such as $SiO_2$.

In example 12 the subject matter of the Examples 1-11 can optionally include wherein the top electrode includes at least one member selected from the group comprising TiN, TaN, W, Ru, Ir, TiAlN, and TaAlN while the bottom electrode includes at least one member selected from the group comprising W, Pd, Pt, Ru, Mo, and TiN.

In an embodiment the top and bottom electrodes include different materials. In an embodiment, the "top" electrode may be a metal or alloy of metals (TiN, TaN, W, Ru, Ir, TiAlN, or other good barrier materials) while the "bottom" electrode is a high workfunction metal" (W, Pd, Pt, Ru, Mo, TiN or other high work function metal).

In example 13 the subject matter of the Examples 1-12 can optionally include wherein the oxide layer directly contacts the OEL.

The direct contact may preclude barrier layers and the like.

In example 14 the subject matter of the Examples 1-13 can optionally include wherein the memory is a resistive random access memory (RRAM).

In example 15 the subject matter of the Examples 1-14 can optionally include a system comprising: a processor; a memory, coupled to the processor, according to any one of examples 1 to 14; and a communication module, coupled to the processor, to communicate with a computing node external to the system.

Example 16 includes a memory comprising: a top electrode and a bottom electrode; an oxide layer, including oxide, between the top and bottom electrodes; wherein the oxide layer includes oxygen vacancies and a member selected from the group comprising Deuterium, Chlorine, and Fluorine.

In example 17 the subject matter of the Example 16 can optionally include wherein: (a) the member is oxidized, (b) a portion of oxide is reduced and is non-stoichiometric, and (c) an additional portion of oxide is not reduced and is stoichiometric.

Example 18 includes a method comprising: forming a bottom electrode; forming an oxide layer on the bottom electrode; forming an oxygen exchange layer (OEL) on the oxide layer; forming a top electrode on the OEL; patterning the oxide layer and the OEL to form a resistive random access memory (RRAM) cell; doping the oxide layer with Deuterium; and annealing the oxide layer to produce oxygen vacancies.

In example 19 the subject matter of the Example 18 can optionally include doping the oxide layer before annealing the oxide layer.

In example 20 the subject matter of the Example 18 can optionally include doping the oxide layer after annealing the oxide layer.

The foregoing description of the embodiments of the invention has been presented for the purposes of illustration and description. It is not intended to be exhaustive or to limit the invention to the precise forms disclosed. This description and the claims following include terms, such as left, right, top, bottom, over, under, upper, lower, first, second, etc. that are used for descriptive purposes only and are not to be construed as limiting. For example, terms designating relative vertical position refer to a situation where a device side (or active surface) of a substrate or integrated circuit is the "top" surface of that substrate; the substrate may actually be in any orientation so that a "top" side of a substrate may be lower than the "bottom" side in a standard terrestrial frame of reference and still fall within the meaning of the term "top." The term "on" as used herein (including in the claims) does not indicate that a first layer "on" a second layer is directly on and in immediate contact with the second layer unless such is specifically stated; there may be a third layer or other structure between the first layer and the second layer on the first layer. The embodiments of a device or article described herein can be manufactured, used, or shipped in a number of positions and orientations. Persons skilled in the relevant art can appreciate that many modifications and variations are possible in light of the above teaching. Persons skilled in the art will recognize various equivalent combinations and substitutions for various components shown in the Figures. It is therefore intended that the scope of the invention be limited not by this detailed description, but rather by the claims appended hereto.

What is claimed is:

1. A memory comprising:
   a top electrode and a bottom electrode;
   an oxygen exchange layer (OEL) between the top and bottom electrodes; and
   an oxide layer, including oxide, between the OEL and the bottom electrode;
   wherein the oxide layer includes: (a) Deuterium; (b) a first plurality of oxygen vacancies, at a surface of the oxide layer that is adjacent the OEL, at a first concentration, and (c) a second plurality of oxygen vacancies, at another surface of the oxide layer, at a second concentration that is less than the first concentration.

2. The memory of claim 1, wherein the Deuterium is oxidized and a portion of the oxide is reduced.

3. The memory of claim 2, wherein: (a) the portion of the oxide is non-stoichiometric, and (b) an additional portion of the oxide is not reduced and is stoichiometric.

4. The memory of claim 3, wherein the Deuterium is chemically bound to oxygen vacancies that are included in the oxide layer.

5. The memory of claim 1, wherein the oxide includes a lattice structure and the Deuterium is directly adjacent oxygen vacancies that are included in the lattice structure.

6. The memory of claim 1, wherein:
   in a first state when energy is applied to the top electrode at a first polarity the first and second pluralities of oxygen vacancies form a first filament having a first electrical resistance; and
   in a second state when energy is applied to the top electrode at a second polarity, which is opposite the first polarity, the first and second pluralities of oxygen vacancies form a second filament having a second electrical resistance that is greater than the first electrical resistance.

7. The memory of claim 6, wherein in the second state the second plurality of oxygen vacancies is at the second concentration and in the first state the second plurality of oxygen vacancies is at an additional concentration that is greater than the second concentration.

8. The memory of claim 1, wherein the OEL includes a metal.

9. The memory of claim 8, wherein the metal includes at least one of Hafnium (Hf), Titanium (Ti), Tantalum (Ta), Erbium (Er), Gadolinium (Gd), or combinations thereof.

10. The memory of claim 9, wherein the oxide layer includes at least one of $HfO_x$, $SiO_x$, $Al_2O_x$, $TiO_x$, TaOx, GdOx, ErOx, NbOx, WOx, ZnOx, InGaZnOx, or combinations thereof.

11. The memory of claim 10, wherein:
   the top electrode includes at least one of TiN, TaN, W, Ru, Ir, TiAlN, TaAlN, or combinations thereof;
   the bottom electrode includes at least one of W, Pd, Pt, Ru, Mo, TiN, or combinations thereof.

12. The memory of claim 1, wherein the oxide layer directly contacts the OEL.

13. The memory of claim 1, wherein the memory is a resistive random access memory (RRAM).

14. A system comprising:
   a processor;
   a memory, coupled to the processor, according to claim 1; and
   a communication module, coupled to the processor, to communicate with a computing node external to the system.

15. A memory comprising:
   a top electrode and a bottom electrode;
   an oxygen exchange layer (OEL) between the top and bottom electrodes;
   an oxide layer, including oxide, between the top and bottom electrodes;
   wherein the oxide layer includes: (a) at least one of Deuterium, Chlorine, Fluorine, or combinations thereof; (b) a first plurality of oxygen vacancies, at a surface of the oxide layer where the surface is adjacent the OEL, at a first concentration, and (c) a second plurality of oxygen vacancies, at another surface of the oxide layer, at a second concentration that is less than the first concentration.

16. The memory of claim 15, wherein: (a) the at least one of Deuterium, Chlorine, Fluorine, or combinations thereof is oxidized, (b) a portion of the oxide is reduced and is non-stoichiometric, and (c) an additional portion of the oxide is not reduced and is stoichiometric.

17. The memory of claim 15, wherein:
   the OEL includes at least one of Hafnium (Hf), Titanium (Ti), Tantalum (Ta), Erbium (Er), Gadolinium (Gd), or combinations thereof;
   the oxide layer includes at least one of $HfO_x$, $SiO_x$, $Al_2O_x$, $TiO_x$, TaOx, GdOx, ErOx, NbOx, WOx, ZnOx, InGaZnOx, or combinations thereof.

18. A system comprising:
a processor;
a memory, coupled to the processor, according to claim 17; and
a communication module, coupled to the processor, to communicate with a computing node external to the system.

19. A method comprising:
forming a bottom electrode;
forming an oxide layer on the bottom electrode;
forming an oxygen exchange layer (OEL) on the oxide layer;
forming a top electrode on the OEL;
patterning the oxide layer and the OEL to form a resistive random access memory (RRAM) cell;
doping the oxide layer with Deuterium; and
annealing the oxide layer to produce oxygen vacancies;
wherein the oxide layer includes: (a) a first plurality of oxygen vacancies, at a surface of the oxide layer wherein the surface is adjacent the OEL, at a first concentration, and (b) a second plurality of oxygen vacancies, at another surface of the oxide layer, at a second concentration that is less than the first concentration.

20. The method of claim 19, comprising doping the oxide layer before annealing the oxide layer.

21. The method of claim 19, comprising doping the oxide layer after annealing the oxide layer.

22. A memory comprising:
a top electrode and a bottom electrode;
an oxygen exchange layer (OEL) between the top and bottom electrodes; and
an oxide layer, including oxide, between the OEL and the bottom electrode;
wherein the oxide layer includes: (a) Deuterium; (b) a first plurality of oxygen vacancies adjacent the OEL at a first concentration, and (c) a second plurality of oxygen vacancies, between the first plurality of oxygen vacancies and the bottom electrode, at a second concentration that is less than the first concentration.

23. The memory of claim 22, wherein: (a) a portion of the oxide is non-stoichiometric, and (b) an additional portion of the oxide is stoichiometric.

24. The memory of claim 22, wherein:
the OEL includes a metal that includes at least one of Hafnium (Hf), Titanium (Ti), Tantalum (Ta), Erbium (Er), Gadolinium (Gd), or combinations thereof;
the oxide layer includes at least one of $HfO_x$, $SiO_x$, $Al_2O_x$, $TiO_x$, TaOx, GdOx, ErOx, NbOx, WOx, ZnOx, InGaZnOx, or combinations thereof.

25. The memory of claim 24, wherein the oxide layer directly contacts the OEL.

* * * * *